United States Patent
Ohkita et al.

(10) Patent No.: US 6,461,183 B1
(45) Date of Patent: Oct. 8, 2002

(54) TERMINAL OF SOCKET CONNECTOR

(75) Inventors: Masao Ohkita, Tu-Chen (TW); Chao-Chung Cheng, Tu-'Chen (TW); Nick Lin, Tu-Chen (TW); Fang-Chu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/035,576

(22) Filed: Dec. 27, 2001

(51) Int. Cl.[7] ............................................. H01R 13/625
(52) U.S. Cl. ...................... 439/342; 439/259; 439/857
(58) Field of Search ................................... 439/342, 259, 439/856, 857, 263, 264, 83

(56) References Cited

U.S. PATENT DOCUMENTS

| | | | |
|---|---|---|---|
| 4,534,611 A | * | 8/1985 | Wohlfart ...................... 439/857 |
| 5,213,530 A | * | 5/1993 | Uratsuji ...................... 439/342 |
| 6,142,810 A | * | 11/2000 | Hsiao et al. ................. 439/857 |

\* cited by examiner

*Primary Examiner*—Tho D. Ta
(74) *Attorney, Agent, or Firm*—Wei Te Chung

(57) ABSTRACT

A socket connector includes a housing positioned on a circuit board and movably supporting a cover. Cells are defined in the housing for retaining dual-beam terminals. The cover carries a central processing unit module having pin legs extending through holes defined in the cover and projecting into the cells of the housing. The cover is movable in a moving direction to bring the pin legs into engagement with the terminals. Each terminal includes a base section retained in each cell and a tail extending and beyond the housing for being soldered to the circuit board. Two beams extend from the base section, substantially opposite to the tail. Each beam forms a spring arm. The spring arms are opposite to and spaced from each other for engaging the corresponding pin leg therebetween. The beams are symmetric with respect to an imaginary plane that is normal to the base section and coincident with the moving direction. Each beam has a major surface angularly offset from the imaginary plane and thus forming a first included angle with the imaginary plane. The major surface also forms a second included angle with the base section. The included angles are smaller than 90 degrees and greater than 0 degree. Preferably, the included angles are 45 degrees. The angularly offset configuration of the beams allows easy adjustment of the space between the spring arms and thus adjustment of the performance parameters of the terminals.

5 Claims, 6 Drawing Sheets

TERMINAL OF SOCKET CONNECTOR

BACKGROUND OF THE INVENTION

1. Field of the Invention

The present invention generally relates to a socket connector comprising conductive terminals for electrically connecting an electronic device, such as a central processing unit (CPU) module, to a circuit board, and more particular to the structure of the terminals.

2. The Related Arts

Socket connectors for mounting an electronic device, such as a central processing unit (CPU) module, to a circuit board are well known and are commonly used in the computer industry. FIG. 1 of the attached drawings shows an example of the socket connectors that is referred to as ZIF (Zero Insertion Force) socket connector. The socket connector, generally designated with reference numeral 10, comprises a housing 12, made of an insulation material, defining an array of open cells 14 in which conductive terminals (not shown in FIG. 1) are received and a cover 16 movably supported on the housing 12. The cover 16 defines through holes 18 corresponding to the cells 14 of the housing 12. The cover 16 carries a CPU module 20 with pin legs 22 of the CPU module 20 extending through the holes 18 of the cover 16 and partially projecting into the cells 14. An actuator 24 drives the cover 16 to move in a predetermined direction A in such a manner to bring the pin legs 24 of the CPU module 20 into contact with the terminals of the housing 12 thereby forming electrical connection therebetween. Examples of socket connectors of this type are also disclosed in U.S. Pat. Nos. 4,498,725, 5,833,483, 6,059,596, 6,142,8 10, and 6,159,032.

A number of different terminals for the socket connectors are available. They can be roughly classified as single-beam terminals and dual-beam terminals. Terminals of both types have a base section received and securely retained in the cell of the housing and a tail extending from the base and beyond a lower face of the housing for being soldered to the circuit board. A signal-beam terminal has a single beam extending from base section substantially in a direction opposite to the tail and forming a spring arm on a free end of the beam, while a dual-beam terminal has two beams opposite to each other. An example of the dual beam-terminal is illustrated in U.S. Pat. No. 4,498,725 and shown is FIG. 2 of the attached drawings. The dual-beam terminal, generally designated with reference numeral 30 in FIG. 2, comprises a base section 32 and a tail 34 extending from the base section 32 in a downward direction (as viewed in FIG. 2). Two beams 36 extend from the base section 32 in an upward direction that is substantially opposite to the downward direction of the tail 34. The beams 36 are opposite to each other and spring arms 38 are formed on free ends thereof and extending in a horizontal direction substantially parallel to the predetermined direction A and normal to the upward and downward directions. Free ends 40 of the spring arms 38 are convergent to each other for reducing the space therebetween.

Since the beams 36 and the spring arms 38 are made substantially opposite to each other, forming a mirror symmetry configuration. The pin leg 22 of the CPU module 20 that engages with the spring arms 38 of the terminal 30 is first inserted into the space between the spring arms 38. When the cover 16 moves in the direction A, the pin leg 22 is driven into the reduced space between the free ends 40 of the spring arms 38 for forming electrical connection therebetween.

The terminal 30 is usually made by stamping a metal plate, followed by mechanically forming the beams 36 and the spring arms 38. Conventionally, a major surface of each beam 36 is made substantially parallel to an imaginary plane defined by the direction A and the upward direction whereby the pin leg 22 is guided in the direction A. Such a conventional design suffers certain deficiencies. For example, the gap size between the free ends 40 of the spring arms 38 is difficult to adjust. Spring rate of the spring arms 38 is also difficult to adjust and this in turn makes the normal force acting upon the pin leg 22 by the spring arms 38 difficult to adjust in order to achieve optimum electrical and mechanical engagement between the spring arms 38 and the pin leg 22. Such deficiencies are even more severe in a housing having compactly arranged terminals for the terminal pitch is reduced. Reduced terminal pitch indicates the spring arms 38 must be shortened, leading to difficulty for adjustment of the above parameters.

Thus, it is desired to have a terminal configured to overcome the above mentioned deficiencies.

SUMMARY OF THE INVENTION

An object of the present invention is to provide a dual-beam terminal of a socket connector that allows easy adjustment of contact gap between opposite spring arms thereof.

Another object of the present invention is to provide a dual-beam terminal of a socket connector that allows easy adjustment of spring rate and thus the normal force acting upon a pin leg engaging therewith.

A further object of the present invention is to provide a dual-beam terminal having a performance adjustable configuration of the beams.

To achieve the above objects, in accordance with the present invention, a socket connector comprises a housing positioned on a circuit board and movably supporting a cover. Cells are defined in the housing for receiving and retaining dual-beam terminals. The cover carries a central processing unit module having pin legs extending through holes defined in the cover and partially projecting into the cells of the housing. The cover is movable in a moving direction to bring the pin legs into engagement with the corresponding terminals. Each dual-beam terminal comprises a base section received and firmly retained in the corresponding cell and a tail extending from the base section and beyond the housing for being soldered to the circuit board. Two beams extend from the base section, substantially opposite to the tail. Each beam forms a spring arm on a free end thereof. The spring arms are opposite to and spaced from each other for engaging the corresponding pin leg therebetween. The beams are symmetric with respect to an imaginary plane that is normal to the base section and coincident with the moving direction. Each beam has a major surface angularly offset from the imaginary plane and thus forming a first included angle with the imaginary plane. The major surface also forms a second included angle with the base section. The included angles are smaller than 90 degrees and greater than 0 degree. Preferably, the included angles are 45 degrees. The angularly offset configuration of the beams allows easy adjustment of the space between the spring arms and thus adjustment of the performance parameters of the terminals.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
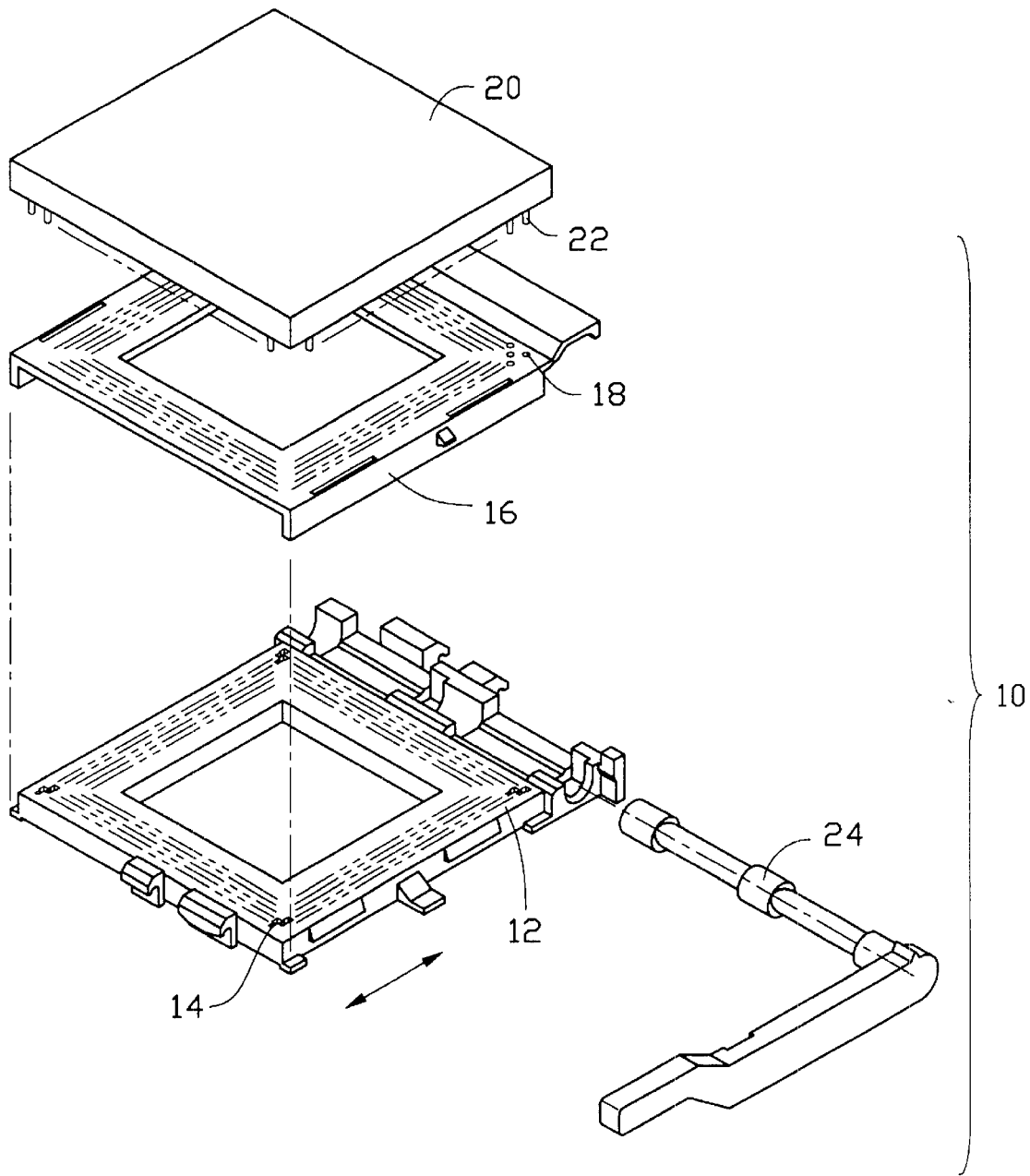
FIG. 1 is an exploded view of a socket connector.
Figure 2:
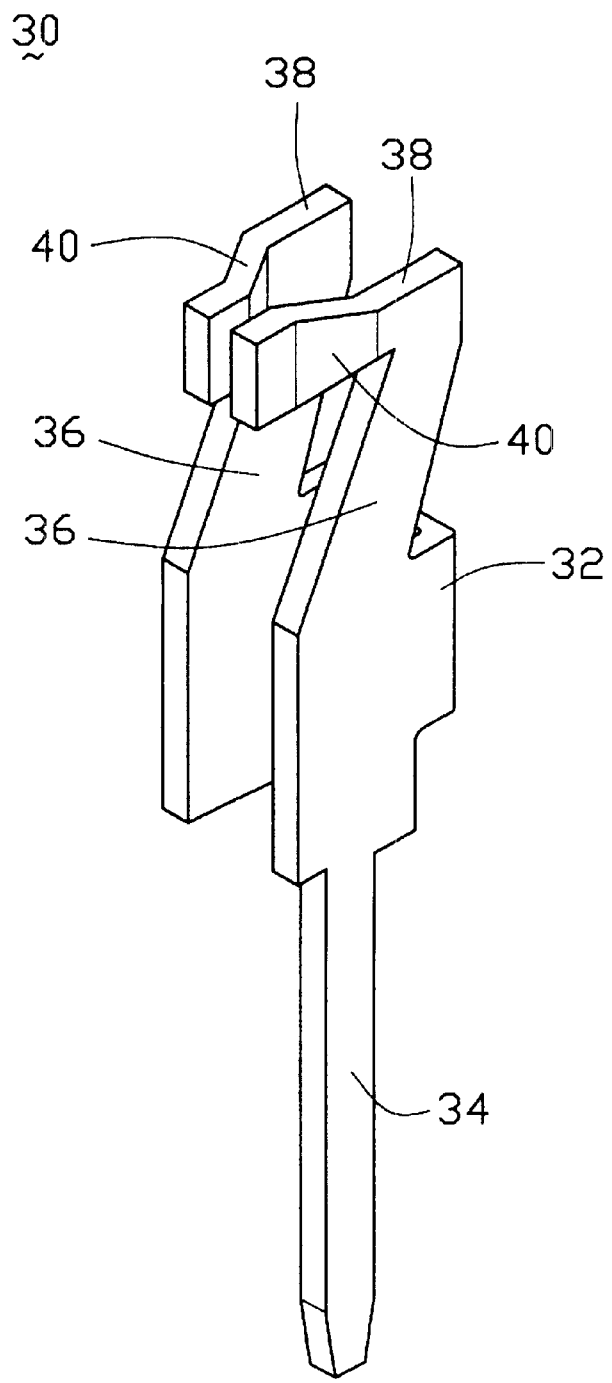
FIG. 2 is a perspective view of a conventional conductive terminal that can be received and retained in a cell of the socket connector of FIG. 1.
Figure 3:
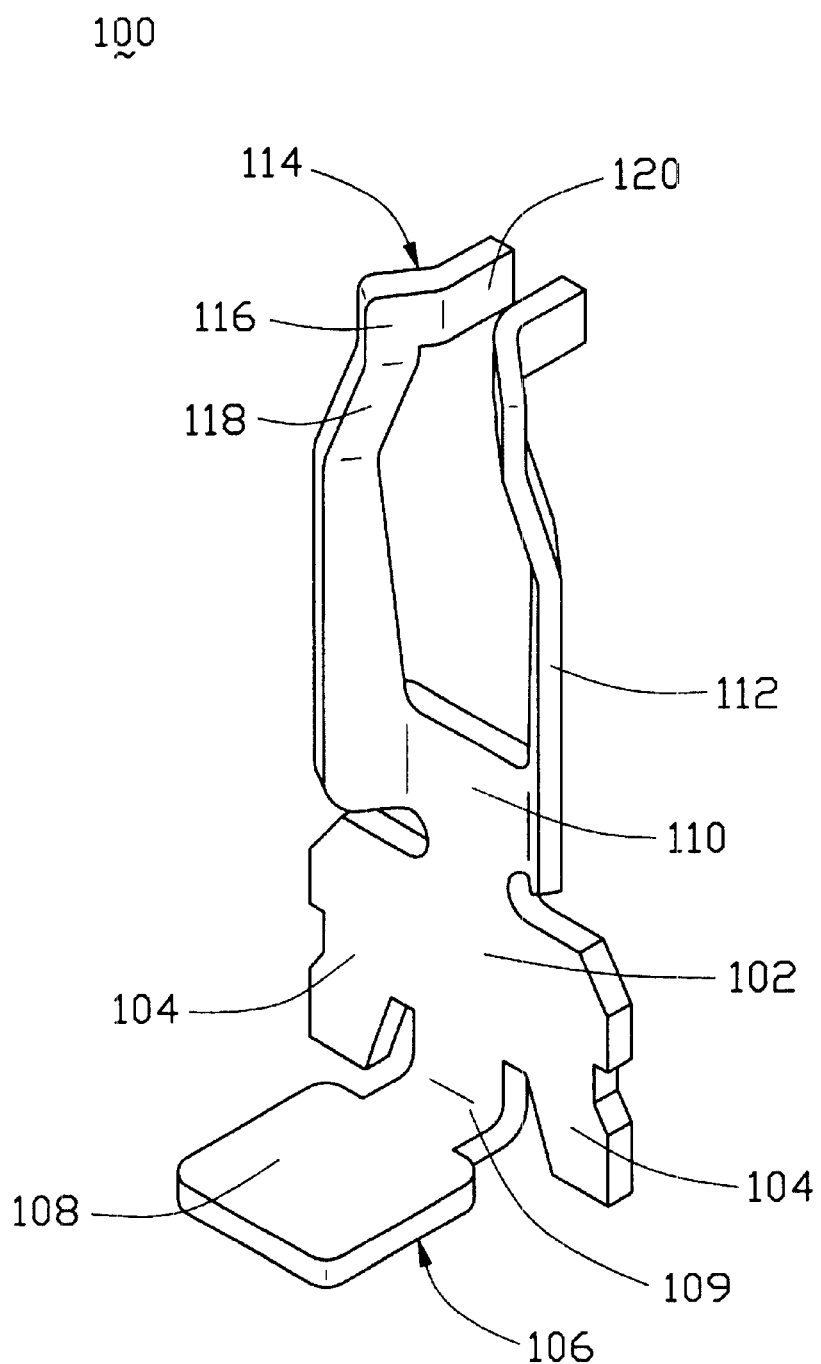
FIG. 3 is a perspective view of a conductive terminal constructed in accordance with the present invention that can be received and retained in the cell of the socket connector of FIG. 1.
Figure 4:
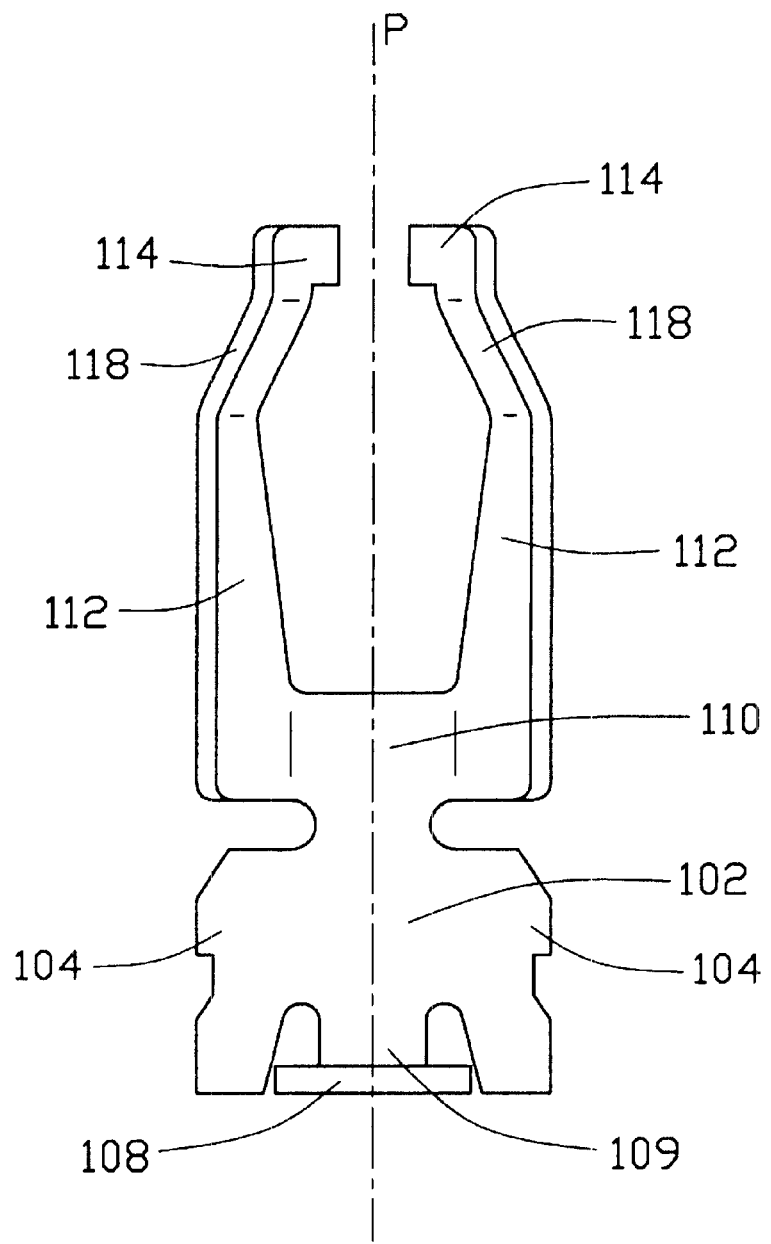
FIG. 4 is a front view of the conductive terminal of the present invention.
Figure 5:
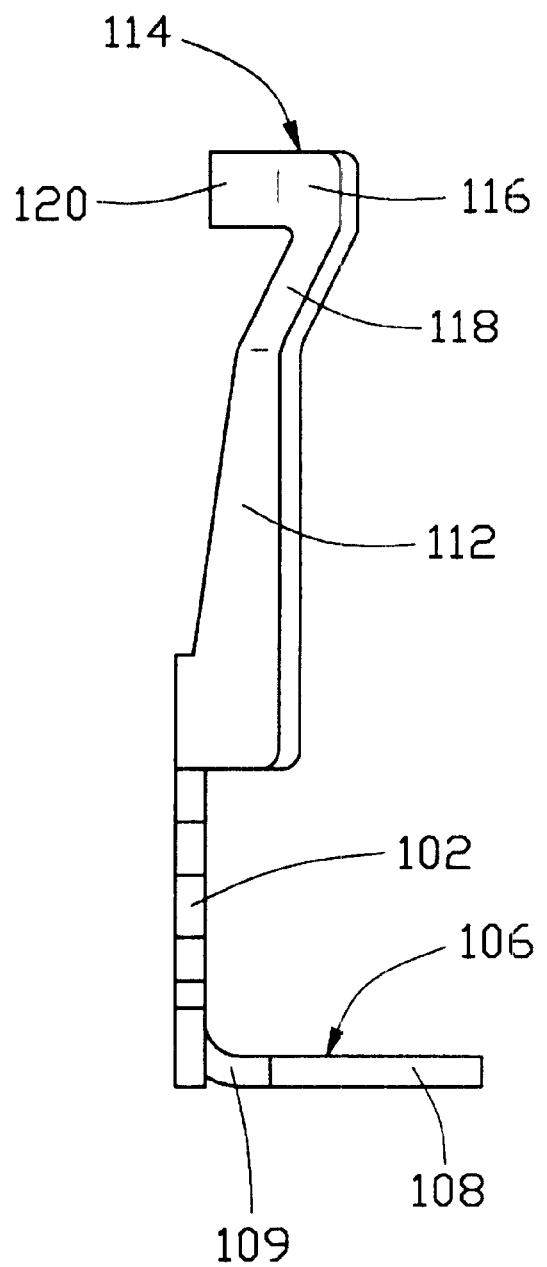
FIG. 5 is a side elevational view of the conductive terminal of the present invention.
Figure 6:
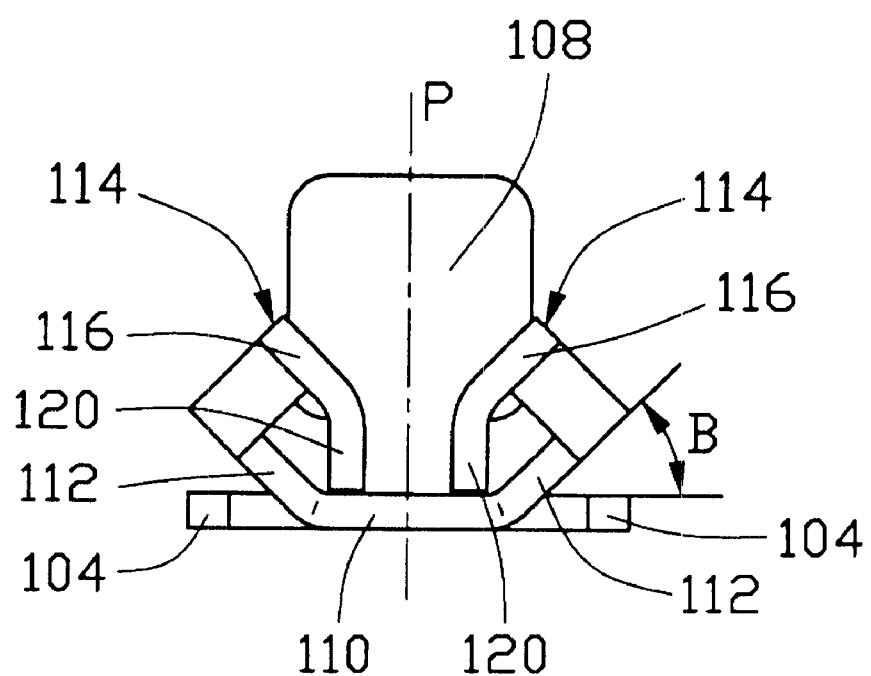
FIG. 6 is a top view of the conductive terminal of the present invention.

With reference to the drawings and in particular to FIGS. 3–6, a conductive terminal constructed in accordance with the present invention, generally designated with reference numeral 100, is to be received and retained in a cell 14 defined in a housing 12 of a socket connector 10 (FIG. 1). The terminal 100 is made by stamping a metal plate and followed by subsequent forming operations. The terminal 100 comprises a base section 102 having a first major surface (not labeled). The base section 102 is received in the cell 14 and forms barbed edges 104 on opposite sides thereof for interferentially engaging the cell 14 to firmly retain the terminal 100 in the cell 14. A tail section 106 extends from a lower edge of the base section 102. The tail section 106 comprises a solder pad 108 connected to the lower edge of the base section 102 by a neck portion 109. The neck portion 109 is bent an angle of approximately 90 degrees whereby a second major surface of the solder pad 108 is substantially normal to the first major surface of the base section 102.

The solder pad 106 can carry a solder ball (not shown) for connecting the terminal 100 to a circuit board (not shown) by Surface Mount Technology (SMT). However, it is apparent to those having ordinary skills to form a tail configured to employ the "through-hole" technique for connecting the terminal 100 to the circuit board. This is well known and no further description is necessary herein.

An extension 110 is formed on an upper edge of the base section 102. Two beams 112 extend from opposite edges of the extension 110 in an upward direction that is substantially parallel to the first major surface of the base section 102. The beams 112 are spaced from each other for accommodating movement of a pin leg 22 of an electronic device 20 (FIG. 1) in a predetermined moving direction A therebetween. In the embodiment illustrated, the beams 112 are made symmetric with respect to an imaginary central plane P (FIGS. 4 and 6) and the central plane P bisects the base section 102 and the terminal 100 itself. That is the terminal 100 is symmetric with respect to the central plane P and thus the moving direction A is coincident with the central plane P. However, it is not necessary to be so.

Each beam 112 has a third major surface angularly offset from the first major surface and the central plane P by a given angle. Namely, the third major surface forms an included angle B with the first major surface of the base section 102 and the third major surface also forms an included angle (not labeled) with respect to the central surface P. The angle B is preferably 45 degrees. In other words, the third major surface also forms a 45 degree included angle with respect to the central plane P. It is, however, apparent to those having ordinary skills to adapt a different value of the included angle B. The included angle B can be any angle greater than 0 degree but smaller than 90 degrees.

A spring arm 114 has a proximal section 116 connected to a free end of each beam 112 by a connection section 118 and a distal section 120 extends from the proximal section 116 and away from the beam 112 in a direction substantially parallel to the moving direction A of the pin leg 22 and the central plane P. The spring arms 114 are symmetrical with respect to the central plane P.

The proximal sections 116 of the spring arms 114 are spaced from each other and are arranged to convergent toward each other whereby the distance between the proximal sections 116 is reduced toward a minimum gap (not labeled) between the distal sections 120. The distal sections 120 are substantially parallel to each other and spaced from each other by the gap that corresponds the minimum distance between the proximal sections 116. The convergent configuration of the proximal sections 116 functions to lead the pin leg 22 of the electronic device 20 into the gap between the distal sections 120. The gap between the distal sections 120 is selected to have the distal sections 120 of the spring arms 114 firmly engage the pin leg 22. The angularly offset beams 112 allows flexibility in setting and adjusting performance parameters of the terminal 100, such as the gap between the spring arms 114 and the spring rate of the beams 112 and the spring arms 114 experienced by the pin leg 22.

It is, however, apparent to those skilled in the art to switch the functions of the distal sections 120 and the proximal sections 116. Namely, the distal sections 120 are arranged in a convergent manner to serve as a lead-in of the pin leg 22, while the proximal sections 116 are substantially parallel to each other as well as the moving direction A of the pin leg 22 (or the central plane P) and form a small gap therebetween for electrically and mechanically engaging the pin leg 22.

In the embodiment illustrated, the connection section 118 are inclined toward the central plane P and thus convergent toward each other as they extend away from the beams 112 for reducing the distance between the spring arms 114 and also for more flexibility in setting and adjusting the performance parameters.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A conductive terminal comprising:

a base section adapted to be received and firmly retained in a cell defined in a housing, the base section having a first major surface;

two beams extending from a first edge of the base section and symmetric with respect to an imaginary plane, each beam having a major surface angularly offset with respect to the imaginary plane by an angle; and a tail extending from a second edge of the base section and opposite to the beams;

wherein each beam forms a spring arm, the spring arms being symmetrical with respect to the imaginary plane, each spring arm comprising a lead-in section and an engaging section, the lead-in sections being convergent toward the imaginary plane with a distance between the lead-in sections gradually reduced to a minimum gap between the engaging sections;

wherein each spring arm is connected to the corresponding beam by an inclined connection section;

wherein the inclined connection section connects the engaging section of each spring arm to a free end of the corresponding beam;

wherein the tail comprises a solder pad connected to the second edge of the base section by a neck portion whereby the solder pad is substantially normal to the first major surface of the base section;

wherein the base section forms barbed side edges for interferentially engaging the cell.

2. The conductive terminal as claimed in claim 1, wherein the offset angle is around 45 degrees.

3. A socket connector adapted to mount an electronic device having pin legs to a circuit board, the socket connector comprising:

a housing defining cells therein;

a cover movably supported on the housing and defining through holes corresponding to the cells, the cover being adapted to carry the electronic device with the pin legs extending through the holes of the cover and partially extending into the cells of the housing and move the electronic device and the pin legs in a given moving direction with respect to the housing; and a conductive terminal comprising:

a base section received and fixed in each cell of the housing;

two beams extending from a first edge of the base section toward the cover, each beam forming a spring arm, the spring arms being located on opposite sides of an imaginary plane parallel to the moving direction, and spaced from each other for accommodating the movement of the pin leg therebetween, each spring arm comprising a lead-in section and an engaging section, the lead-in sections being convergent toward the imaginary plane with a distance between the lead-in sections gradually reduced to a minimum gap between the engaging sections where the pin leg engages the spring arms; and a tail extending from a second edge of the base section and opposite to the beams, the tail being adapted to be soldered to the circuit board;

wherein each beam has a major surface angularly offset with respect to the imaginary plane by an angle;

wherein each spring arm is connected to the corresponding beam by an inclined connection section;

wherein the inclined connection section connects the engaging section of each spring arm to a free end of the corresponding beam;

wherein the tail comprises a solder pad connected to the second edge of the base section by a neck portion whereby the solder pad is substantially normal to the base section;

wherein the offset angle is smaller than 90 degrees and greater than 0 degree;

wherein the spring arms are symmetric with respect to the imaginary plane;

wherein the base section has a major surface substantially normal to the imaginary plane and wherein the imaginary plane bisects the base section whereby the terminal is substantially symmetric with respect to the imaginary plane.

4. The socket connector as claimed in claim 3, wherein the base section forms barbed side edges for interferentially engaging the cell of the housing.

5. The socket connector as claimed in claim 3, wherein the offset angle is around 45 degrees.

* * * * *